United States Patent [19]

Higashi et al.

[11] Patent Number: 5,069,999
[45] Date of Patent: Dec. 3, 1991

[54] PS PLATE FOR MAKING LITHOGRAPHIC PRINTING PLATE REQUIRING NO DAMPENING WATER

[75] Inventors: Tatsuji Higashi; Mitsumasa Tsuchiya; Nobuyuki Kita, all of Shizuoka, Japan

[73] Assignee: Fuji Photo Film Co., Ltd., Kanagawa, Japan

[21] Appl. No.: 603,382

[22] Filed: Oct. 26, 1990

[30] Foreign Application Priority Data

Nov. 20, 1989 [JP] Japan ................................. 301568

[51] Int. Cl.$^5$ ................................................. G03C 1/76
[52] U.S. Cl. ..................................... 430/272; 430/271; 430/273; 430/281; 430/283; 430/284; 430/306; 430/950
[58] Field of Search ............... 430/271, 272, 273, 281, 430/283, 284, 550, 523, 532, 396

[56] References Cited

U.S. PATENT DOCUMENTS

| | | | |
|---|---|---|---|
| 4,006,447 | 4/1991 | Umetha et al. | 430/273 |
| 4,323,637 | 4/1987 | Chen et al. | 430/273 |
| 4,427,759 | 1/1984 | Gruetzmacher et al. | 430/273 |
| 4,576,897 | 3/1986 | Fujikawa et al. | 430/273 |
| 4,587,199 | 5/1986 | Bennett | 430/273 |
| 4,743,527 | 5/1988 | Nosheda et al. | 430/273 |
| 4,863,831 | 9/1989 | Kirumae et al. | 430/273 |
| 4,957,850 | 9/1990 | Kusuta et al. | 430/273 |

FOREIGN PATENT DOCUMENTS 0130222  5/1988  European Pat. Off. .

*Primary Examiner*—Jack Brammer
*Attorney, Agent, or Firm*—Burns, Doane, Swecker & Mathis

[57] ABSTRACT

A presensitized plate for use in making a lithographic printing plate requiring no dampening water comprises a substrate provided thereon with in order: (1) a photopolymerizable light-sensitive layer which comprises a monomer or an oligomer having at least one photopolymerizable olefinically unsaturated double bond, an organic solvent-soluble polyurethane resin or polyamide resin which is solid at room temperature and has film-forming ability and a photopolymerization initiator; (2) a crosslinked silicone rubber layer; and (3) a transparent cover coat layer, wherein the photopolymerization initiator comprises dialkylaminoarylcarbonyl compounds and at least one member selected from the group consisting of xanthones, thioxanthones, acrydones, benzophenones which do not carry a dialkylamino group, benzanthrones and anthraquinones and the transparent cover coat layer is formed from a biaxially oriented polypropylene film having a thickness ranging from 6 to 22 $\mu$m and an oxygen permeability ranging from 900 to 10,000 cc/m$^2$/24 hr./at. at 20° C. The presensitized plate does not cause so-called "fogging" even when it is kept to stand under irradiation with white light rays and whose sensitivity is not adversely affected by the degree of vacuum when the plate is exposed to light with a vacuum contact printer.

20 Claims, No Drawings

PS PLATE FOR MAKING LITHOGRAPHIC PRINTING PLATE REQUIRING NO DAMPENING WATER

BACKGROUND OF THE INVENTION

The present invention relates to a presensitized plate for use in making a lithographic printing plate which makes it possible to form printed matters without using no dampening water.

There have been proposed a variety of presensitized plate for use in making a lithographic printing plate requiring no dampening water (the presensitized plate is hereinafter referred to as "water-less PS plate" and the resulting lithographic printing plate is referred to as "water-less lithographic printing plate). Among these, those which comprises a substrate provided thereon with in order a photopolymerizable light-sensitive layer and a silicone rubber layer have very excellent quality and examples thereof are, for instance, disclosed in Japanese Patent Publication for Opposition Purpose (hereunder referred to as "J.P. KOKOKU") Nos. Sho 54-26923 (U.S. Pat. No. 3,894,873) and Sho 56-23150. These photopolymerizable light-sensitive layers undergo a polymerization reaction through a radical polymerization which is inhibited by oxygen. For this reason, Japanese Patent Unexamined Publication (hereunder referred to as "J.P. KOKAI") No. Sho 50 59101 proposes the use of an oxygen-impermeable coating layer of a substance such as polyethylene terephthalate, cellophane, polyvinylidene chloride, polyvinyl chloride, polyvinyl alcohol, polypropylene or polyethylene. If a cover coat obtained from a low oxygen-permeable polyethylene terephthalate or polyvinylidene chloride is employed, the polymerization is not inhibited by oxygen, but the polymerization reaction is initiated in half-exposed and/or non exposed portions of the light-sensitive layer as soon as the PS plate which is not exposed or imagewise exposed to light is kept to stand under irradiation of white light rays, hence so-called "fogging" phenomenon arises and it is correspondingly impossible to develop the plate. If polyethylene or polypropylene which has relatively high oxygen permeability is used, the problem of "fogging" does not arise even if it is kept to stand under the irradiation of white light rays, but when it is imagewise exposed to light with a vacuum contact printer, the degree of polymerization-inhibition varies depending on the degree of vacuum of the printer and correspondingly the sensitivity and tone reproduction are different between the central portion and the edge portion of the plate.

SUMMARY OF THE INVENTION

Accordingly, an object of the present invention is to provide a water-less PS plate which does not cause "fogging" even when it is kept to stand under irradiation with white light rays and whose sensitivity is not adversely affected by the degree of vacuum when the plate is exposed to light with a vacuum contact printer.

The inventors of this invention have conducted various studies to achieve the foregoing Object and, as a result have found out that a water-less PS plate whose photopolymerization is not greatly affected by oxygen can be obtained by using an organic solvent-soluble polyurethane resin or polyamide resin, as a binder, and a photopolymerization initiator comprising a combination of an aromatic aminocarbonyl compound with a specific aromatic carbonyl compound in the photopolymerizable light-sensitive layer of a water-less PS plate which comprises a substrate provided thereon with in order a photopolymerizable light-sensitive layer, a silicone rubber layer and a transparent cover coat; and using a biaxially oriented polypropylene film having a relatively high oxygen permeability as the transparent cover coat layer, and thus have completed the present invention.

According to the present invention, there is consequently provided a water-less PS plate which comprises a substrate provided thereon with in order:

(1) a photopolymerizable light-sensitive layer which comprises a monomer Or an oligomer having at least one photopolymerizable olefinically unsaturated double bond, an organic solvent-soluble polyurethane resin or polyamide resin which is solid at room temperature and has film-forming ability and a photopolymerization initiator;
(2) a crosslinked silicone rubber layer; and
(3) a transparent cover coat layer, and which is characterized in that the photopolymerization initiator comprises a dialkylaminoarylcarbonyl compound and at least one member selected from the group consisting of xanthones, thioxanthones, acridones, benzophenones which do not carry a dialkylamino group, benzanthrones and anthraquinones and in that the transparent cover coat is formed from a biaxially oriented polypropylene film having a thickness ranging from 6 to 22 $\mu$m and an oxygen permeability ranging from 900 to 10,000 cc/m$^2$/24 hr./atm. (at 20° C.).

DETAILED DESCRIPTION OF THE INVENTION

The present invention will hereinafter be explained in more detail.

The water-less dithographic printing plate must have flexibility sufficient for putting it on the usual printing press and can withstand the load which is applied thereto during printing operations. For this reason, typical substrates usable are, for instance, coated paper, a metal plate such as an aluminum plate, a plastic film such as a polyethylene terephthalate film, a rubber plate or a composite plate thereof. These substrates may have a primer layer on the surface thereof for the purposes of inhibiting halation or the like.

Various kinds of primer layers may be sued in the invention for various purposes such as improvement in adhesion between the substrate and the photopolymerizable light-sensitive layer as well as inhibition of halation, improvement in printing properties and optionally improvement in dyability of images. Examples thereof are those obtained by exposing, to light, a variety of light-sensitive polymers prior to the application of the photopolymerizable light-sensitive layer to harden the polymers as disclosed in J.P. KOKAI No. Sho 60-229031; those obtained by heat curing epoxy resins as disclosed in J.P. KOKAI No. Sho 62-50760; and those obtained by hardening gelatin films as disclosed in J.P. KOKAI No. Sho 63-133153 (U.S. Pat. No. 4,861,698); as well as hardened casein films, hardened polyurethane resin films, hardened polyamide films, hardened styrene/butadiene rubber layers, hardened carboxyl-modified styrene/butadiene rubber layers, hardened acrylonitrile/butadiene rubber layers, hardened carboxyl-modified acrylonitrile/butadiene rubber layers, hardened polyisoprene layers and hardened acrylate rubber layers. These primer layers may be used in any combination and may further comprise, depending on purposes, dyes, pH indicators, printing out agents, photopolymerization intitators, auxiliary agent for adhesion such as polymerizable monomers, diazo resins, silane coupling agents, titanate coupling agents, aluminum coupling agents, isocyanate compounds and carboxyl group-containing resins and additives such as white pigments and silica powder. The amount of the primer layer coated in general ranges from 0.5 to 20 g/m² (on dry basis).

The photopolymerizable light-sensitive layer used in the invention comprises (i) a monomer or an oligomer having at least one photopolymerizable olefinically unsaturated double bond; (ii) an organic solvent-soluble polyurethane resin or polyamide resin which is solid at room temperature and has film-forming ability and (iii) a photopolymerization initiator which comprises dialkylaminoaryl-carbonyl compounds and at least one member selected from the group consisting of xanthones, thioxanthones, acridones, benzophenones which do not carry a dialkylamino group, benzanthrones and anthraquinones. The light-sensitive layer may optionally comprise (iv) other organic solvent-soluble polymeric compounds having film forming ability.

Each component of the light-sensitive layer will be explained below in more detail.

Component (i): monomer or oligomer having at least one photo polymerizable olefinically unsaturated double bond As the foregoing monomers or oligomers usable in the present invention, there may be mentioned, for instance, monofunctional (meth)acrylates such as polyethylene glycol (meth)acrylate, polypropylene glycol (meth)acrylate, phenoxyethyl (meth)acrylate, 2-(meth-)acryloxyethyl hydrogen phthalate and 2-(meth)a- cryloxyethyl hydrogen succinate; polyethylene glycol di(meth)acrylate, polypropylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate and sodium (meth)acrylate; those obtained by adding ethylene oxide or propylene oxide to polyfunctional alcohols such as glycerin and trimethylolethane and then converting the adduct into (meth) acrylates; urethane acrylates such as those disclosed in J.P. KOKOKU Nos. Sho 48-41708 and Sho 50-6034 and J.P. KOKAI No. Sho 51-37193; polyester acrylates as disclosed in J.P. KOKAI No. Sho 48-64183 and J.P. KOKOKU Nos. Sho 49-43191 and Sho 52-30490; polyfunctional (meth)acrylates such as epoxy acrylates obtained by reacting epoxy resins with (meth)acrylic acid; and N-methylolacrylamide derivatives as disclosed in U.S. Pat. No, 4,540,649. In addition, it is also possible to use those disclosed in Journal cf the Adhesion Society of Japan, Vol. 20, No. 7, pp. 300–308 (1984) as photo- hardenable monomers and oligomers. Moreover, examples of the monomers or oligomers also include reaction products of allyl isocyanate or a compound:

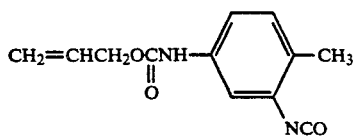

with (meth)acrylate compounds carrying a hydroxyl group such as hydroxyethyl (meth)acrylate, hydroxypropyl (meth)acrylate, polyethylene glycol mono(meth)acrylate, polypropylene glycol mono(meth)acrylate, pentaerythritol tri(meth)acrylate, dipentaerythritol tetra(meth)acrylate, compounds of the following formulae:

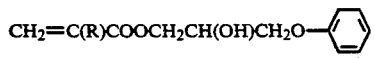

$CH_2=C(R)COOCH_2CH(OH)CH_2O-CH_2CH(OH)CH_2-O-$ $CH_2CH(OH)CH_2OOCC(R)=CH_2, \quad CH_2=C(R)COO-$ $CH_2CH(OH)CH_2-O-C_2H_4O-CH_2CH(OH)CH_2OOCC(R)=CH_2,$ $CH_2=C(R)COO-CH_2CH(OH)CH_2-O-CH_2CH(CH_3)-$ $OCH_2CH(OH)CH_2OOCC(R)=CH_2,$

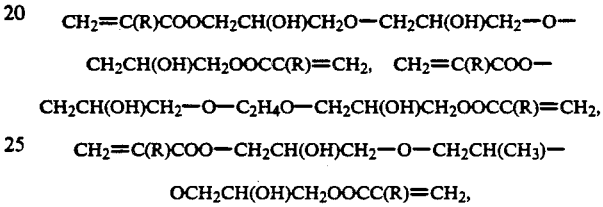

$CH_2CH(OH)CH_2OOCC(R)=CH_2,$

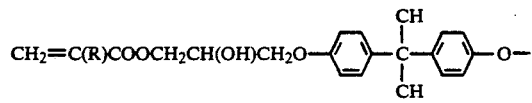

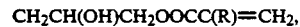

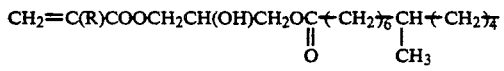

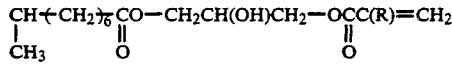

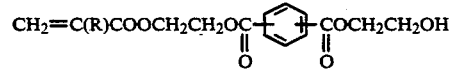

(wherein R represents a hydrogen atom or a methyl group); reaction products of allyl glycidyl ether with (meth)acrylate compounds carrying a carboxyl group such as (meth)acrylic acid, (meth)acryloxyethyl hydrogen phthalate, (meth)acryloxyethyl hydrogen succinate, (meth)acryloxyethyl hydrogen maleate, (meth) acryloxyethyl hydrogen tetrahydrophthalate and (meth) acryloxyethyl hydrogen hexahydrophthalate; reaction products of allyl alcohols or 2-allyloxyethyl alcohols with the foregoing (meth)acrylate compounds carrying a carboxyl group or an acid chloride thereof; and reaction products of amino compounds such as xylenediamine, ethylenediamine, isophoronediamine or monoethanolamine with glycidyl methacrylate or allyl glycidyl ether.

Component (ii): orqanic solvent-soluble polyurethane resin or polyamide resin which is solid at room temperature and has film-forming ability The foregoing polyurethane resins usable in the invention are basically those obtained by reacting a diisocyanate with approximately equimolar amount of a diol or those obtained by reacting a diol with a slight excess of a diisocyanate and then subjecting the reaction product to a chain extending reaction with a diamine, a diol or water. Examples of diisocyanates include toluenediisocyanate, xylylenediisocyanate, diphenylmethanediisocyanate, hexamethylenediisocyanate, isophoronediisocyanate, diphenyl ether diisocyanate, hydrogenated xylylenediisocyanate, cyclohexanediisocyanate, hydrogenated diphenylmethanediisocyanate, tetramethylxylenediiso-cyanate and lysinediisocyanate; and typical examples of diols are polypropylene glycol, polyethylene glycol, polytetramethylene glycol, ethylene oxide propylene oxide copolymer, tetrahydrofuran-ethylene oxide copolymer, tetrahydrofuranpropylene oxide copolymer, polyesterdiol such as polyethylene adipate, polydiethylene adipate, polypropylene adipate, polyhexamethylene adipate, polyneopentyl adipate, polyhexamethyleneneopentyl adipate, polyethylenediethylene adipate and polyethylenehexamethylene adipate; poly-ε-caprolactonediol, polyhexamethylenecarbonatediol and polytetramethy-lene adipate.

In addition, branched polyurethane resins can also be used and examples thereof are those obtained by replacing a part or all of the diisocyanate with isocyanate compounds having at least three functional groups such as those obtained by adding three moles of 2,4-toluenediisocyanate to one mole of trimethylolpropane, undecanetriisocyanate, dicycloheptanetriiso cyanate, 1,8 diisocyanate-4-isocyanatemethyloctane, and simultaneously replacing a part of the diol component with monofunctional moncalcohols such as allyl alcohol, allyloxyethyl alcohol, hydroxyethyl (meth)acrylate, polyethylene glycol mono(meth)acrylate, polypropylene glycol (meth)acrylate, hydroxypropyl mono(meth)acrylate, benzyl alcohol or ethyl alcohol to thus introduce functional groups.

Besides, useful examples further include polyurethane resins derived from diol components having a special functional groups such as alkyldialkanolamine, (meth)acrylate group-containing diols and carboxyl group-containing diols. In particular, it is also possible to obtain alkaline water-soluble polyurethane resins by using carboxyl group-containing diols as disclosed in J.P. KOKAI Nos. Sho 63-287942 and Sho 63-287943.

The polyamide resins usable in the invention may be, for instance, known copolymerized polyamides soluble in an organic solvent such as an alcohol and N-substituted polyamides. More specifically, there may be mentioned, for instance, copolymerized amides such as binary copolymers comprising a polycapramide component (nylon 6 component) and a polyhexamethyleneadipoamide component (nylon 66 component) (nylon 6/nylon 66 copolymers), copolymers obtained by copolymerizing nylon 6 and nylon 66 components with polyhexamethylenesebacamide component (nylon 610 component) (nylon 6/nylon 66/nylon 610 copolymers), nylon 6/66/12 copolymers, nylon 6/66/PACM-6 copolymers and nylon 6/66/PACM-8 copolymers obtained by copolymerizing nylon 6 and nylon 66 components with a third component such as polylauroamide component (nylon 12 component), poly-di(p-aminocyclohexyl) methaneadipoamide component (nylon PACM-6 component) or polydi(p-aminocyclohexyl)-methanesuberamide component (nylon PACM-8 component); as well as N-methylol, N-alkoxymethyl or N allyloxymethyl derivatives of a variety of polyamides. Besides, also useful are those obtained by copolymerizing 1,3-bis(aminomethyl)cyclohexane and cyclohexane 1,4-dicarboxylic acid with the aforementioned amide components as disclosed in J. P. KOKAI No. Sho 51-74704.

As water-soluble or water-dispersible polyamide resins, there may be mentioned, for instance, polyamides carrying sulfonic acid groups or sulfonate groups obtained by copolymerizing sodium 3,5-dicarboxybenzenesulfonate or the like as disclosed in J.P. KOKAI No. Sho 48-72250; polyamides having ether bonds obtained by copolymerizing one of dicarboxylic acids, diamines and cyclic amides having an ether bond in the molecule as disclosed in J.P. KOKAI No. Sho 49-43565; polyamides having basic nitrogen atoms obtained by copolymerizing N,N'-di(γ-aminopropyl)piperadine or the like and polyamides obtained by quaternizing the polyamides having basic nitrogen atoms with acrylic acid or the like as disclosed in J.P. KOKAI No. Sho 50-7605; copolymerized polyamides containing polyether segments having a molecular weight ranging from 150 to 1,500 as disclosed in J.P. KOKAI No. Sho 55-74537; and polyamides obtained by ring opening polymerization of α-(N,N'-dialkylamino)-ε-caprolactam or by ring opening copolymerization of α-(N,N'-dialkylamino)-ε-caprolactam and ε-caprolactam. Other useful polyamide resins are, for instance, products obtained by addition-polymerizing organic diisocyanate compounds with amide compounds, both ends of which are substantially primary and/or secondary amido groups and which have at least one amido bond.

Component (iii): Photopolymerization Initiator

Examples of the photopolymerization initiators usable in the present invention are combinations of (a) a dialkylaminoarylcarbonyl compound with (b) at least one member selected from the group consisting of xanthones, thioxanthones, acridones, benzanthrones, benzophenones (provided that they do not have any dialkylamino group) and anthraquinones. More specifically, examples of the dialkylaminoaryl-carbonyl compounds are 4,4'-bis(dimethylamino)benzophenone (popular name: Michler's ketone), 4,4'-bis(diethylamino)benzophenone (popular name: ethyl Michler's ketone), 4,4'-bis(dipropylamino) benzophenone and the compound of the formula:

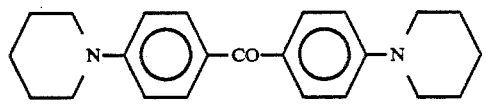

as disclosed in J.P. KOKAI No. Sho 60-63532 (U.S. Pat. No. 4,661,434); dialkylaminostyryl ketone compounds represented by the following general formulae:

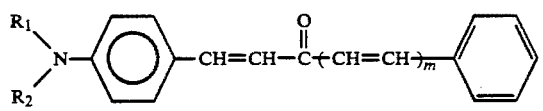

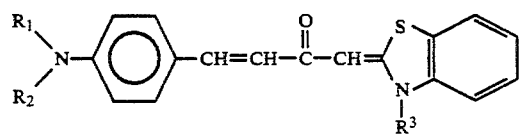

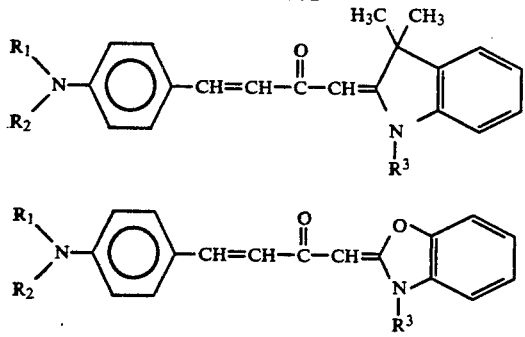

(wherein R¹, R² and R³ each represents an alkyl or substituted alkyl group and optionally R¹ and R² may form a cycloalkyl ring) as disclosed in J.P. KOKAI No. Sho 55-50001 (U.S. Pat. No. 4,259,432); compounds such as 2-(p-dialkylaminophenyl) benzoxazole, 2-(p-dialkylaminophenyl)benzo [4,5] benzoxazole and 2,5-bis(p-dialkylaminophenyl)-1,3,4-oxadiazole (wherein the alkyl group represents a methyl or ethyl group) as disclosed in J.P. KOKAI No. Sho 60-84304 (U.S. Pat. No. 4,594,310); and compounds such as those represented by the following formulae:

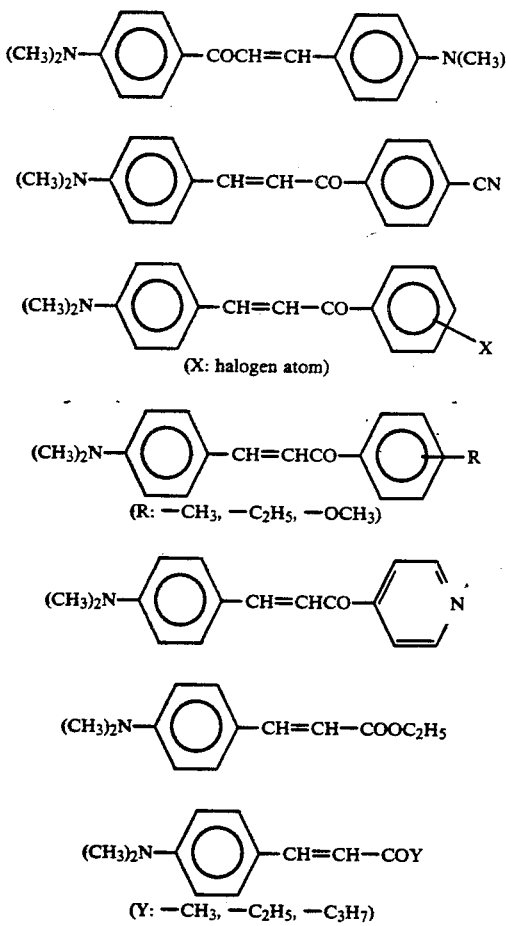

as disclosed in J.P.. KOKAI No. Sho 53-60718.

Specific examples of the xanthones, thioxanthones, acridones, benzophenones (provided that they do not have a dialkylamino group), and benzanthrones are xanthone, 2-chloroxanthone, thioxanthone, 2-chlorothioxanthone, 2,4-dimethylthioxanthone, 2,4 diethylthioxanthone, 2,4dichlorothioxanthone, 2,4-diisopropylthioxanthone, 2-dodecylthioxanthone, 2-methyl-(5~8)-ethyl ester thioxanthone, octyl ester of thioxanthonedicarboxylic acid, 1-chloroanthraquinone, 2-chloroanthraquinone, 2-ethylanthraquinone, 2-t-butylanthraquinone, 1-chloro-N-methylacridone, 3-chloro-N-methylacridone, 2,3-dichloro-N-methylacridone, 2-chloro-N-ethylacridone, 2-chloro-N-butylacridone, 3-chloro-N-benzylacridone, N-benzylacridone, N-butylacridone, N-ethylacridone, benzophenone, 1 chloro-benzophenone, 2-chlorobenzophenone, benzanthrone, 3-chloro benzanthrone and dichlorobenzanthrone.

The total amount of these photopolymerization initiators to be added to the light-sensitive layer ranges from 0.1 to 20% by weight and preferably 3 to 15% by weight on the basis of the total weight of the composition for the light sensitive layer.

The weight ratio of the initiator (a) and the initiator (b) ranges from 10:1 to 1:10 and more preferably 5:1 to 1:5.

Component (iv): Polymeric Compounds Having Film-Forming Ability Other Than Component (ii)

Examples of the optional other organic solvent soluble polymeric compounds having film-forming ability used in the present invention are methacrylic acid copolymers, acrylic acid copolymers, crotonic acid copolymers, maleic acid copolymers, partially esterified maleic acid copolymers, acidic cellulose derivatives, polyvinylpyrrolidone, polyethylene oxide, polyester, unsaturated polyester, polystyrene, epoxy resins, phenoxy resins, polyvinyl butyral, polyvinyl formal, polyvinyl chloride, polyvinyl alcohol, polyvinyl alcohol partially converted into acetal, gelatin and water soluble cellulose derivatives.

In addition, examples of the polymeric compounds carrying, on the side chains, photopolymerizable or photocrosslinkable and olefinically unsaturated double bonds include allyl (meth) acrylate-co-(meth)acrylic acid-co-optional other addition-polymerizable vinyl monomers and alkali metal salts or amine salts thereof as disclosed in J.P. KOKAI No. Sho 59-53836 (U.S. Pat. No. 4,687,727); those obtained by reacting hydroxyethyl (meth) acrylate-co-(meth)acrylic acid-co-alkyl (meth)acrylate and alkali metal salts or amine salts thereof with (meth)acrylic acid chloride as disclosed in J.P. KOKOKU No. Sho 59-45979; those obtained by adding, through half-esterification, pentaerythritol triacrylate to maleic anhydride copolymers and alkali metal salts or amine salts thereof as disclosed in J.P. KOKAI No. Sho 59-71048 (U.S. Pat. 4,537,855); those obtained by adding, through half-esterification, monohydroxyalkyl (meth) acrylate, polyethylene glycol mono(meth)acrylate or polypropylene glycol mono(meth)acrylate to styrene-co-maleic anhydride and alkali metal salts or amine salts thereof; those obtained by reacting a part of carboxyl groups of (meth)acrylic acid copolymers or crotonic acid copolymers with glycidyl (meth) acrylate and alkali metal salts or amine salts thereof; those obtained by reacting hydroxyalkyl (meth)acrylate copolymers, polyvinyl formals or polyvinyl butyrals with maleic anhydride or itaconic anhydride and alkali metal salts or amine salts thereof; those obtained by reacting hydroxyalkyl (meth)acrylate-co-(meth)acrylic acid with an adduct: 2,4-tolylenediisocyanate/hydroxyalkyl (meth)acrylate (1:1)

and alkali metal salts or amine salts thereof; meth-
)acrylic acid copolymer which is partially reacted with
ally glycidyl ether and alkali metal salts or amine salts
thereof as disclosed in J.P. KOKAI No. Sho 59-53836
(U.S. Pat. No. 4,687,727); vinyl (meth)acrylate-co-
(meth)acrylic acid and alkali metal salts or amine salts
thereof; allyl (meth) acrylate-co-sodium styrenesulfon-
ate; vinyl (meth)acrylate-co-sodium styrenesulfonate;
allyl (meth)acrylate-co-sodium acrylamido-1,1-dime-
thylethylenesulfonate; vinyl (meth)acrylate-co-sodium
acrylamido-1,1 dimethylethylenesulfonate; 2-allylox-
yethyl methacrylate co-methacrylic acid; and 2-allylox-
yethyl methacrylate-co-2-methacryloxyethyl hydrogen
succinate.

The ratio of the total amount of the components (ii)
and (iv) to that of the monomer of component (i) prefer-
ably ranges from 99:1 to 30:70 and more preferably 97:3
to 50:50.

Other Components of the Photopolymerizable
Light-Sensitive Layer

In addition to the foregoing components, the Photo-
polymerizable light-sensitive layer may preferably com-
prise a heat polymerization inhibitor and useful exam-
ples thereof are hydroquinone, p-methoxyphenol, di-t
butyl-p-cresol, pyrogallol, t-butylcatechol, benzoqui-
none, 4,4'-thiobis(3-methyl-6 t-butylphenol), 2,2'-
methylenebis(4-methyl 6-t-butylphenol) and 2-mercap-
tobenzimidazole. In addition, the light-sensitive layer
may optionally comprise dyes and/or pigments for
coloring the layer as well as pH indicators and/or leuco
dyes as printing out agents. It is also possible to incorpo-
rate, into the photopolymerizable light-sensitive layer, a
small amount of a silicone compound selected from the
group consisting of polydimethylsiloxane, methyl-
styrene modified polydimethylsiloxane, olefin-modified
polydimethylsiloxane, polyether-modified polydimeth-
ylsiloxane, silane coupling agents, silicone diacrylates
and silicone dimethacrylates. The photopolymerizable
light-sensitive layer may further comprise fluorine atom
containing surfactants or fluorine atom-containing
agents for surface orientation in order to improve coat-
ing properties of the light-sensitive composition. A
diazo resin may be added to the light-sensitive layer for
improving the adhesion between the photopolymeriz-
able light sensitive layer and the primer layer. The
amount of these additives is in general not more than
10% by weight on the basis of the total weight of the
photopolymerizable light sensitive layer. In order to
enhance the sensitivity of the photopolymerizable light-
sensitive layer per se, it is possible to incorporate, into
the layer, other radical generating agent such as hexa-
arylbiimidazole as disclosed in J.P. KOKAI Nos. Sho
61-123603 and Sho 57-21401 and U.S. Patent No.
4,565,769 in an amount ranging from 0.5 to 10% by
weight on the basis of the total weight of the light sensi-
tive layer. Besides, it is also possible to add, to the pho-
topolymerizable light-sensitive layer, silica powder or
hydrophobic silica powder whose surface is treated
with a silane coupling agent carrying a (meth)acryloyl
or aryl group in an amount of not more than 50% by
weight on the basis of the total weight of the photopo-
lymerizable light-sensitive layer to enhance the adhe-
sion of the light-sensitive layer to a silicone rubber layer
which is subsequently applied thereto and will be de-
tailed below.

The composition for the foregoing photopolymeriz-
able light-sensitive layer is dissolved in a proper solvent
such as 2-methoxyethanol, 2-methoxyethyl acetate,
methyl lactate, ethyl lactate, propylene glycol mono-
methyl ether, methanol, ethanol, methyl ethyl ketone,
water or a combination thereof and then applied onto
the surface of a substrate. The amount thereof coated
suitably ranges from about 0.1 to 10 g/m$^2$, preferably
0.5 to 5 g/m$^2$ (weighed after drying).

The crosslinked silicone rubber layer used in the
present invention is a layer of partially or completely
crosslinked polydiorganosiloxane comprising the fol-
lowing repeating units:

Wherein R represents a monovalent group such as an
alkyl, aryl or alkenyl group or a combination thereof
which may have functional groups selected from the
group consisting of halogen atoms, amino groups, hy-
droxyl group, alkoxy groups, aryloxy groups, (meth)a-
cryloxy groups and thiol groups. The silicone rubber
layer may optionally comprise fine powder of an inor-
ganic such as silica, calcium carbonate or titanium ox-
ide; an auxiliary agent for adhesion such as the afore-
mentioned silane coupling agents, titanate coupling
agents or aluminum coupling agents; and/or a photopo-
lymerization initiator.

Polysiloxanes having functional groups at the ends
thereof and a molecular weight of from several thou-
sands to several hundreds of thousand are in general
used as starting materials for polymers (silicone rub-
bers) having the foregoing polysiloxane chain as the
main skeleton. The silicone rubber layer can be obtained
by crosslinking and hardening the starting material in
accordance with the following method. In other words,
the silicone rubber layer can be obtained by mixing the
foregoing polysiloxane having hydroxyl group(s) at
either or both of the ends thereof with a silane coupling
agent represented by the following general formula,
adding, if necessary, an organic metal compound such
as organotin compound, an inorganic acid or an amine
as a catalyst and, condensing and hardening the polysi-
loxane and the silane coupling agent with heating or at
room temperature:

Wherein n is an integer of 1 to 3; R is the same as that
defined above; and X represents a substituent such as
—OH, —OR$^2$, —OAc, —O—N=CR$^2$R$^3$, —Cl, —Br or
—I (wherein R$^2$ and R$^3$ may be the same or different and
each has the same meaning as that for R defined above
and Ac represents an acetyl group).

Alternatively, the silicone rubber layer may be ob-
tained by condensing and hardening the organopolysi-
loxane carrying hydroxyl group(s) at the ends thereof, a
hydrogen polysiloxane crosslinking agent and an op-
tional silane coupling agent defined above.

Useful examples of the silicone rubber layer further
include addition type silicone rubber layer obtained by
crosslinking groups and —CH=CH— groups through an addition reaction. The addition type silicone rubber layer is rather unaffected by humidity during hardening the same, undergoes crosslinking at high speed and hence a crosslinked silicone rubber layer having predetermined physical properties can easily be formed. Regarding the condensed silicone rubber layer, if a carboxylic acid is present in the photopolymerizable light-sensitive layer, the hardening becomes insufficient depending on the kind of the crosslinking agent used, while if the addition type silicone rubber layer is employed, it is sufficiently hardened even if a carboxylic acid is present in the photopolymerizable light-sensitive layer. As has been explained above, the photopolymerizable light-sensitive layer may comprise a carboxylic acid in the latter case and hence the PS plate can be developed with a developer mainly comprising water or an alkaline water. Therefore, the PS plate can easily be designed. The addition type silicone rubber layer herein used can be those obtained through a reaction of polyvalent hydrogen organopolysiloxane with a polysiloxane compound having two or more —CH=CH— bonds in the molecule and desirably those obtained by hardening and crosslinking a composition comprising the following components:

(1) 100 parts by weight of an organopolysiloxane having at least two alkenyl groups, preferably a vinyl group, which are directly bonded to the silicon atom per molecule;

(2) 0.1 to 1,000 parts by weight of an organo hydrogen polysiloxane having at least two

bonds per molecule; and (3) 0.00001 to 10 parts by weight of an addition catalyst.

The alkenyl group of Component (1) may be present either in the middle of or at the ends of the molecular chain and the organopoly-siloxane may have organic substituents other than the alkenyl group, such as substituted or unsubstituted alkyl and/or aryl groups. Component (1) may contain a small number of hydroxyl groups. Component (2) is reacted with Component (1) to form a silicone rubber layer and serves to impart, to the silicone rubber layer, adhesion to the photopolymerizable light-sensitive layer. The hydrogen atom of Component (2) may be present in the middle of or at the end of the molecular chain and Component (2) may also have other organic groups other than the hydrogen atom, selected from the group consisting of those defined above in connection with Component (1). It is preferred that at least 60% of the organic groups of Components (1) and (2) be methyl groups from the viewpoint of ink repellency of the resulting silicone rubber layer. Components (1) and (2) may have a linear, cyclic or branched structure and the molecular weight of at least one of them preferably exceeds 1,000 from the viewpoint of physical properties of the rubber layer and more preferably the molecular weight of Component (1) exceeds 1,000.

Examples of Component (1) are α,ω-divinylpolydimethyl siloxane and methylvinyl siloxane-co-dimethylsiloxane having methyl groups at both ends; those of Component (2) are polydimethylsiloxane having hydrogen atoms at both ends, α, ω-dimethylpolymethyl hydrogen siloxane, methyl hydrogen siloxane-co-dimethylsiloxane having methyl groups at both ends and cyclic polymethyl hydrogen siloxane.

The addition catalysts, Component (3), may be selected from any known ones, but platinum compounds are particularly preferred and examples thereof are elemental platinum, platinum chloride, chloroplatinic acid and platinums coordinated with olefins.

The composition for obtaining the silicone rubber layer may optionally comprise a crosslinking inhibitory agent such as a vinyl group-containing organopolysiloxane (e.g., tetracyclo(methylvinyl)siloxane), a carbon-carbon triple bond containing alcohol, acetone, methyl ethyl ketone, methanol, ethanol or propylene glycol monomethyl ether for controlling the hardening speed of the composition.

These compositions undergo an addition reaction and thus start hardening as soon as the foregoing three components are mixed together. In this respect, the hardening speed is rapidly increased as the reaction temperature is elevated. Therefore, it is preferred that the composition be maintained under a high temperature condition at which the properties of the substrate and the photopolymerizable light-sensitive layer are not changed till the composition is completely hardened for the purpose of shortening the time for hardening it on the light-sensitive layer and for extending the pot life thereof. Thus, stable adhesion between the rubber layer and the light sensitive layer can be ensured.

In addition to the foregoing components, the composition for the silicone rubber layer may comprise a known adhesion-imparting agent such as an alkenyl trialkoxysilane or those represented by the following formulae:

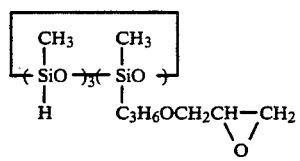

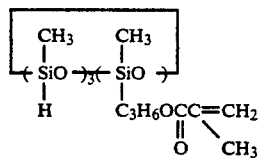

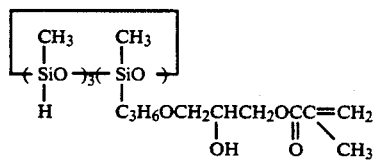

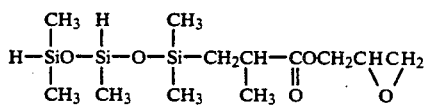

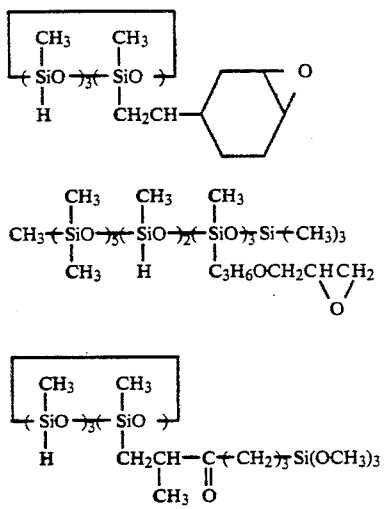

and a hydroxyl group-containing organopolysiloxane, a silicone oil consisting of dimethylpolysiloxane whose end is a trimethylsilyl group, dimethylpolysiloxane having a trimethylsilyl group at the end, a silicone oil consisting of a phenylmethylpolysiloxane copolymer and/or hydrolyzable functional group-containing silane (or siloxane) which are components of the condensed silicone rubber layers. Moreover, a known filler such as silica may be added to the composition in order to improve the strength of the resulting silicone rubber layer.

In the present invention, the silicone rubber layer ultimately serves as an ink repellent layer. If the thickness thereof is too small, the ink repellency thereof is lowered and the resulting layer is easily damaged. On the other hand, if the thickness is too great, the developability of the resulting PS plate is impaired. Thus, it preferably ranges from 0.5 to 5 μm.

In the water less PS plate explained above, it is also possible to apply a variety of other silicone rubber layers on the foregoing silicone rubber layer. An adhesive layer may be applied between the photopolymerizable light sensitive layer and the silicone rubber layer for preventing poisoning by the catalyst present in the composition and for enhancing the adhesion between the photopolymerizable light-sensitive layer and the silicone rubber layer.

The cover coat layer suitably used in the present invention is one obtained from a biaxially oriented polypropylene film having a thickness ranging from 6 to 22μm and an oxygen permeability ranging from 900 to 10,000 cc/m²/24 hr./atm. (at 20° C.). A mat layer may be disposed on these cover coat layers in order to improve the adhesion thereof to an original transparency under vacuum on a printing frame. If the thickness of the cover coat layer is less than 6 μm, such a cover coat layer cannot be formed because of insufficient mechanical strength or it is very expensive even if such a layer can be produced. On the other hand, if it is more than 22μm, the distance between the light-sensitive layer and the images on the original transparency becomes too great and hence the images blur. Moreover, if the oxygen permeability is less than 900 cc/m²/24 hr./atm. (at 20° C.), fogging is easily caused, while if it is more than 10,000 cc/m²/24 hr./atm. (at 20° C.), the imagewise exposure operation is greatly affected by the degree of vacuum in the printing frame of the exposure machine.

In addition, the cover coat layer is preferably biaxially oriented from the viewpoint of the strength thereof.

To improve the adhesion between the cover coat layer and the mat layer, the surface of the cover coat layer may be subjected to a corona discharge treatment and then a mat layer which is partially coated with a polyester resin or a polyvinylidene chloride resin containing silica powder may be applied onto the cover coat layer.

Moreover, to prevent adhesion of the cover coat layer peeled off to the hand or body when the cover coat layer is peeled off after imagewise exposure to light and before development, the cover coat layer may be subjected to antistatic treatment.

Other resins may be applied onto the biaxially oriented polypropylene film or other films can be combined with the biaxially oriented polypropylene film in order to control the oxygen permeability of the cover coat layer.

The water-less PS plate of the present invention is first imagewise exposed to light through an original transparency and then developed with a developer capable of dissolving or swelling a part or whole of the image portions (or non-exposed areas) of the photopolymerizable light sensitive layer or a developer capable of swelling the silicone rubber layer. In this case both the imagewise exposed portions on the light-sensitive layer and the silicone rubber layer or only the silicone rubber layer of the image portions are removed, dependent upon the strength of the developer.

The developer suitably used in the present invention may be any known ones for developing water-less PS plates. Examples thereof include aliphatic hydrocarbons such as hexane, heptane, "Isopar E, H and G" (trade names of the aliphatic hydrocarbons available from ESSO CHEMICAL CO., LTD.), gasoline and kerosine, aromatic hydrocarbons such as toluene and xylene, and halogenated hydrocarbons such as trichlene, to which the following polar solvent is added; as well as the polar solvents per se.

Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, diethylene glycol monohexyl ether, polyethylene glycol monomethyl ether, propylene glycol, tripropylene glycol, polypropylene glycol, triethylene glycol and tetraethylene glycol;

Ketones such as acetone and methyl ethyl ketone;

Esters such as ethyl acetate, methyl lactate, ethyl lactate, butyl lactate, propylene glycol monomethyl ether acetate, carbitol acetate, dimethyl phthalate and diethyl phthalate; and Other polar solvents such as triethyl phosphate and tricresyl phosphate.

It is also possible to use, as a developer, the foregoing organic solvent type developers to which water is added; those obtained by solubilizing the foregoing organic solvent in water with the aid of a surfactant; those obtained by adding, to the foregoing developers, an alkaline agent such as sodium carbonate, monoethanolamine, diethanolamine, triethanolamine, sodium silicate, potassium silicate, sodium hydroxide, potassium hydroxide or sodium borate; or optionally simple tap water or an alkaline water.

In the present invention, a dye such as Crystal Violet or Astrazone Red can be added to a developer to stain the image simultaneously with the development.

The development of the water-less PS plate of the present invention can be performed by any known method, for instance, by rubbing the plate surface with a pad for development containing the foregoing developer or by pouring a developer onto the plate surface and then rubbing the surface with a brush for development in water. Thus, the silicone rubber layer and the light-sensitive layer on the image areas are removed, the surface of the substrate or the primer layer is exposed and serves as an ink receiving part, or only the silicone rubber layer on the image areas is removed and the light-sensitive layer is exposed and serves as an ink receiving part.

As has been explained above in detail, the cover coat layer of the water-less PS plate of the present invention has a relatively high oxygen permeability ranging from 900 to 10,000 $cc/m^2/24$ hr./atm (at 20° C.) and correspondingly the water-less PS plate does not cause so called "fogging" since oxygen serves as a polymerization inhibitor even if it is allowed to stand under irradiation of white light rays. In addition, when a conventional water-less PS plate is imagewise exposed to light with a vacuum contact printer, images blur due to the presence of dust between the plate and an original transparency, while in the present invention, the air (or oxygen) present around the dust serves as a polymerization inhibitor, hence the sensitivity of the portion on which the dust is present is lowered and thus images hardly blur. Moreover, the sensitization with time after imagewise exposure is well suppressed due to the use of a polypropylene film having a relatively high oxygen permeability and thus water-less PS plate having a constant sensitivity can be produced by the present invention. Further, the cover film can easily be peeled off from the light-sensitive layer.

On the other hand, in the present invention, a cover film having a relatively high oxygen permeability is used and simultaneously a polyurethane resin or a polyamide resin having a relatively low oxygen permeability is used as a binder for the photopolymerizable light-sensitive layer and the photopolymerization initiator used in the light-sensitive layer comprises (a) a dialkylaminoarylcarbonyl compound and (b) at least one member selected from the group consisting of xanthones, thioxanthones, acridones, benzanthrones, benzophenones and anthraquinones. Therefore, the sensitivity of the water-less PS plate of the present invention is not lowered at all and the polymerization of the light-sensitive layer of the PS plate is not inhibited at all due to the oxygen in the air even if the degree of vacuum in the vacuum printer is lowered to 0.5 atm.

The present invention will hereinafter be explained in more detail with reference to the following non limitative working Examples and the practical effects achieved by the invention will also be discussed in detail in comparison with Comparative Examples.

Examples 1 to 3 and Comparative Examples 1 to 4

A JIS A 1050 aluminum plate having a thickness of 0.3 mm which had been degreased in the usual manner was dipped in a 1% aqueous solution of an aminosilane coupling agent, KBM 603 (available from Shin-Etsu Chemical Co., Ltd.) and then dried at room temperature. The following primer solution was applied onto the aluminum plate so that the coated amount thereof was 5 $g/m^2$ (weighed after drying) and heated at 140° C. for 2 minutes to dry and harden the film.

| Component | Amount (part by weight) |
|---|---|
| SANPRENE IB 1700D (30% solution of thermoplastic polyurethane resin having a terminal hydroxyl group in methyl ethyl ketone; available from SANYO CHEMICAL INDUSTRIES, LTD.) | 10 |
| TAKENATE D 110N (75% solution of a polyfunctional isocyanate compound in ethyl acetate; available from Takeda Chemical Industries, Ltd.) | 0.2 |
| $TiO_2$ | 0.3 |
| Defenser MCF 323 (30% solution of fluorine atom-containing nonionic surfactant in methyl isobutyl ketone; available from DAINIPPON INK AND CHEMICALS, INC.) | 0.03 |
| Propylene glycol monomethyl ether acetate | 30 |

A solution of a photopolymerizable light-sensitive composition having the following composition was applied onto the primer layer thus formed on the aluminum plate in an amount of 3 $g/m^2$ (weighed after drying) and then dried at 100° C. for one minute.

| Component | Amount (part by weight) |
|---|---|
| Polyurethane resin comprising isophorone diisocyanate (1 mole)/polyesterdiol having a molecular weight of 2,000 (0.2 mole) consisting of adipic acid · ethylene glycol · butanediol/butanediol (0.4 mole)/ isophoronediamide (0.4 mole) which is subjected to chain-extension by the diamine | 1.5 |
| Adduct of xylenediamine (1 mole) with glycidyl methacrylate (4 moles) | 0.9 |
| Polyethylene glycol diacrylate (molecular weight of the polyethylene glycol = 400) | 0.6 |
| Photopolymerization Initiator (Table I) | x |
| Naphthalenesulfonate of Victoria Pure Blue BOH | 0.01 |
| Defenser MCF 323 (30% solution of fluorine atom-containing nonionic surfactant in methyl isobutyl ketone; available from DAINIPPON INK AND CHEMICALS, INC.) | 0.03 |
| Methyl ethyl ketone | 15 |
| Dimethylsulfonamide | 5 |

Then a solution of a composition for silicone rubber layer having the following composition was applied onto the photopolymeriz-able light-sensitive layer so that the coated amount thereof was 2.0 $g/m^2$ (on dry basis) and dried at 140° C. for 2 minutes to give a silicone rubber layer.

| Component | Amount (part by weight) |
|---|---|
| α, ω-Divinylpolydimethylsiloxane (degree of polymerization = about 700) | 9 |
| Compound of the following formula: | 1 |

$$CH_3-Si(CH_3)_2-O-(SiO(CH_3)_2)_{30}-(SiO(H))_{10}-Si(CH_3)_3$$

| Compound of the following formula: | 0.2 |

-continued

| Component | Amount (part by weight) |
|---|---| light portions or the half tone dot area of shadowed portions) when the imagewise exposure had been performed under vacuum are listed in the following Table I.

TABLE I

Effect of the Difference in Kinds of the Photopolymerization Initiators and Degree of Vacuum During Exposure on the Sensitivity and Half Tone Dot Reproduction (200 lines/inch)

| Photopolymerization Inititor (amount: part by weight) | Gray Scale Sensitivity | | Half Tone Dot Reproduction* |
|---|---|---|---|
| | Vacuum | non-vacuum | |
| Ex. No. | | | |
| 1    ethyl Michler's ketone (0.2) 2-chlorothioxanthone (0.1) | 9 | 7 | 2 to 98% |
| 2    ethyl Michler's ketone (0.2) 2-chloro-N-butylacridone (0.1) | 7 | 5 | 3 to 98% |
| 3    ethyl Michler's ketone (0.2) 2-chlorothioxanthone (0.05) 2-chloro-N-butylacridone (0.15) | 9 | 7 | 2 to 98% |
| Comp. No. | | | |
| 1    ethyl Michler's ketone (0.2) | 3 | 1 | 15 to 95% |
| 2    2-chloro-N-othioxanthone (0.2) | 6 | 2 | 10 to 97% |
| 3    2-chloro-N-butylacridone (0.2) | 4 | 1 | 20 to 98% |
| 4    compound of the following formula: (0.2) | 14 | 8 | 5 to 90% |

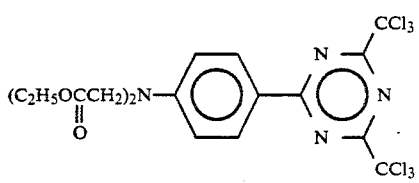

*This is expressed in the gray scale sensitivity at solid steps of 9.

$$[CH_2\!\!-\!\!\underset{\underset{O}{\diagdown\!\diagup}}{CHCH_2}OC_3H_6(CH_3)SiO]\ (\underset{\underset{H}{|}}{\overset{\overset{CH_3}{|}}{Si}}O)_3$$

| | |
|---|---|
| Polydimethylsiloxane (degree of polymerization = about 8,000) | 0.5 |
| Olefin-chloroplatinic acid | 0.2 |
| Inhibitor | 0.15 |
| Isopar G (available from ESSO CHEMICAL CO., LTD.) | 140 |

A one-side matted biaxially oriented polypropylene film having a thickness of 9 μm (oxygen permeability = 5,000 cc/m²/24 hr./atm, at 20° C.) was laminated with the silicone rubber layer thus produced so that the non-matted side thereof came in contact with the silicone rubber layer to give a waterless PS plate.

A positive film carrying half tone dots (200 lines-/inch) and a gray scale having an optical density difference of 0.15 were put on the PS plate and the water-less PS plate was exposed to light with a vacuum exposure machine (available from Nu Arc Co., Ltd. under the trade name of FT261V UDNS ULTRA-PLUS FLIP-TOP PLATE MAKER) under vacuum or ordinary pressure for 30 counts, respectively. Then the laminate film was peeled off, the PS plate was immersed in a liquid tripropylene glycol maintained at 40° C. for one minute, rubbed with a pad for development in water to remove the silicone rubber layer on the non-exposed portions and to thus give a water-less lithographic printing plate. The gray scale sensitivity observed when the kinds of the photopolymerization initiators were changed and the imagewise exposure had been performed under vacuum or at ordinary pressure and the half tone dot reproduction observed at the gray scale sensitivity corresponding to the solid steps of 9 (expressed in the half tone dot area of reproducible high- As seen from Table I, the polymerization of the light-sensitive layer was hardly inhibited by oxygen when specific photopolymerization initiators defined by the present invention were used and water-less lithographic printing plates showing good half tone dot reproduction could be obtained according to the present invention.

Examples 4 to 15 and Comparative Examples 5 to 6

A solution of a composition for a condensed silicone rubber layer having the following composition was applied onto the same aluminum plate to which the same primer layer used in Example 1 and a light-sensitive layer as will be defined below had been applied, instead of the addition type silicone rubber layer used in Example 1 so that the coated amount thereof was 2.0 g/m² (on dry basis) and then dried at 120° C. for 2 minutes to give a hardened silicone rubber layer.

| Component | Amount (part by weight) |
|---|---|
| α, ω-Dihydroxypolydimethylsiloxane (degree of polymerization = about 700) | 9 |
| $CH_3\!\!-\!\!Si(OCCH_3)_3$   $\underset{O}{\overset{\|}{}}$ | 0.3 |
| Tin catalyst | 0.1 |
| Isopar G (available from ESSO CHEMICAL CO., LTD.) | 140 |

A one-side matted biaxially oriented polypropylene film having a thickness of 9 μm identical with that used in Example 1 was laminated with the silicone rubber layer thus obtained to give a water-less PS plate.

The gray scale sensitivity observed when the kinds of the to polymerization initiators were changed and the imagewise exposure of the light-sensitive layer of the PS plate was performed under vacuum or at ordinary pressure are summarized in the following Table II. The formulation of the light-sensitive layer was the same as that used in Example 1 except for changing the kinds of the photopolymerization initiators employed.

TABLE II

Effect of the Difference in Kinds of the Photopolymerization Initiator and the degree of Vacuum During Exposure on the Gray Scale Sensitivity

| Ex. No. | Photopolymerization Initiator (amount: part by weight) | Gray Scale Vacuum | Sensitivity non-vacuum |
|---|---|---|---|
| 4 | Compound of the formula: (0.2) 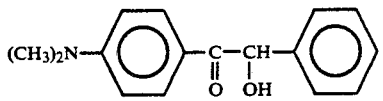 | 7 | 5 |
| 5 | 2-chlorothioxanthone (0.1) ethyl Michler's ketone (0.2) | 9 | 7 |
| 6 | 2-chlorothioxanthone (0.1) ethyl Michler's ketone (0.2) | 9 | 7 |
| 7 | 2-chloroxanthone (0.1) Compound of the formula: (0.2) 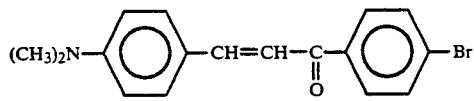 | 7 | 5 |
| 8 | 2-chlorothioxanthone (0.1) Compound of the formula: (0.2) 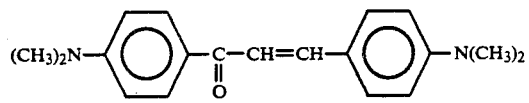 | 8 | 6 |
| 9 | N-ethylacridone (0.1) Compound of the formula: (0.2) 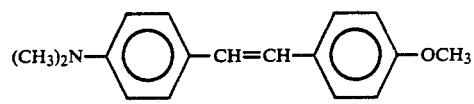 | 7 | 5 |
| 10 | 1-chloroanthraquinone (0.1) Compound of the formula: (0.2) 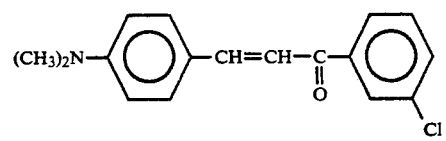 | 7 | 5 |
| 11 | 2-t-butylanthraquinone (0.1) Compound of the formula: (0.2) 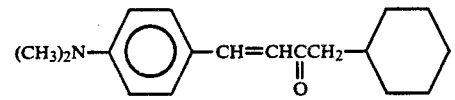 | 8 | 6 |
| 12 | N-phenylacridone (0.1) ethyl Michler's ketone (0.2) | 9 | 7 |
| 13 | 2,4-diethylthioxanthone (0.1) ethyl Michler's ketone (0.1) | 9 | 7 |
| 14 | 2-chlorobenzophenone (0.1) 2-chlorothioxanthone (0.1) Michler's ketone (0.2) | 9 | 7 |
| 15 | 2-chlorothioxanthone (0.1) Michler's ketone (0.2) benzanthrone (0.1) | 5 | 4 |
| Comp. Ex. | | | |

TABLE II-continued

Effect of the Difference in Kinds of the Photopolymerization Initiator and the degree of Vacuum During Exposure on the Gray Scale Sensitivity

| | Photopolymerization Initiator (amount: part by weight) | Gray Scale Vacuum | Sensitivity non-vacuum |
|---|---|---|---|
| 5 | ethyl Michler's ketone (0.2) | 2 | 0 |
| 6 | compound of the formula: (0.2) | 15 | 9 |

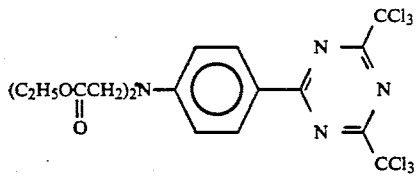

As seen from Table II, the polymerization of the light-sensitive layer was hardly inhibited by oxygen when specific photopolymerization initiators defined by the present invention were used and water-less lithographic printing plates showing good half tone dot reproduction could be obtained according to the present invention.

Example 16

A JIS A1050 aluminum plate having a thickness of 0.3 mm which had been degreased and subjected to a silicate treatment was dipped in a 1% solution of $PF_6$ salt of piazodiphenylamine/paraformaldehyde condensate in methyl cellosolve, withdrawn from the solution and allowed to stand in air to dry the plate. A solution of a composition for photopolymerizable light-sensitive layer having the following composition was applied onto the surface of the aluminum plate thus treated so that the amount thereof coated was 4 $g/m^2$ (on dry basis) and then dried at 100° C. for one minute.

| Component | Amount (part by weight) |
|---|---|
| Polyamide resin [1,3-bis(aminomethyl) cyclohexane (1 mole)/cyclohexane-1,4-dicarboxylic acid (1 mole)/hexamethylenediamine (1 mole)/adipic acid (1 mole)/ε-caprolactam (2.2 mole)] | 1.5 |
| Xylenediamine (1 mole)/glycidyl methacrylate (4 moles adduct) | 0.9 |
| Glycerin diacrylate | 0.3 |
| Ethyl Michler's ketone | 0.2 |
| 2-chlorothioxanthone | 0.1 |
| Defenser MCF 323 (30% solution of fluorine atom-containing nonionic surfactant in methyl isobutyl ketone; available from Dainippon Ink and Chemicals, Inc.) | 0.03 |
| Ethanol | 15 |
| Methyl cellosolve | 5 |

Then the same condensed silicone rubber composition used in Example 4 was applied onto the light-sensitive layer thus applied and dried. A one-side matted biaxially oriented polypropylene film having a thickness of 9 μm identical with that used in Example 4 was laminated with the silicone rubber layer and the resulting water-less PS plate was imagewise exposed to light through a positive film for 10 counts under vacuum with a vacuum exposure machine used in Example 4. Then vacuum with a vacuum exposure machine used in Example 4. Then the cover film was peeled off, the exposed PS plate was developed with the same developer used in Example 4 to give a water-less lithographic printing plate.

Example 17 and Comparative Example 7

A one-side matted cover film as shown in the following Table III was laminated with the plate prepared in Example 3 so that the non-matted side of the film came in contact with the silicone rubber layer to give a water-less PS plate.

The PS plate was imagewise exposed to light under vacuum or at ordinary pressure with the same exposure machine used in Examples 1 to 3 to evaluate the gray scale sensitivity. The results obtained are summarized in Table III.

Moreover, the following test was conducted in order to estimate the degree of fogging.

The non-exposed PS plate obtained above was allowed to stand under irradiation of light (1,000 lux) from a Mitsubishi white fluorescent lamp (PS Neolumisuper FL 40SW/38). The time for allowing to stand was changed at 5-minute intervals over one hour to obtain samples and the samples were developed in the same manner as used in Examples 1 to 3. In this respect, the fogging was expressed in terms of time required for the silicone rubber layer to be unremovable. The oxygen permeability of each cover film was determined by a method for measuring gas permeability of plastic films for packaging foods according to JIS standard Z1707-1975 7.7.

TABLE III

| Ex. No. | Cover Film | Thickness (μm) | $O_2$ Permeability* | Gray Scale Sensitivity vacuum | non-vacuum | Time** (min) |
|---|---|---|---|---|---|---|
| 17 | biaxially orientedy polypropylene film ALPHAN (available from Honshu Paper Co., Ltd. | 9 | 5,000 | 9 | 7.0 | 60 |
| | biaxially orientedy polypropylene film ALPHAN (available | 12 | 4,000 | 9 | 7.3 | 50 |

TABLE III-continued

| Ex. No. | Cover Film | Thickness (μm) | O₂ Permeability* | Gray Scale Sensitivity vacuum | Gray Scale Sensitivity non-vacuum | Time** (min) |
|---|---|---|---|---|---|---|
|  | from Honshu Paper Co., Ltd. biaxially orientedy polypropylene film ALPHAN (available from Honshu Paper Co., Ltd. | 15 | 3,300 | 9 | 7.6 | 40 |
| Comp. Ex. |  |  |  |  |  |  |
| 7 | Lumiler Polyester film (available from Today Industries, Inc.) | 6.5 | 270 | 9 | 9 | 5 |

*This is expressed in the unit of cc/m²/24 hr./atm and is determined at 20° C.
**This means the time required for PS plates to cause fogging.

As seen from Table III, the polymerization of the water-less PS plate of the invention was hardly inhibited by oxygen and the plate hardly caused fogging even under irradiation with light from a white lamp.

What is claimed is:

1. A presensitized plate for use in making a lithographic printing plate requiring no dampening water which comprises a substrate provided thereon with in order:

(1) a photopolymerizable light-sensitive layer which comprises a monomer or an oligomer having at least one photopolymerizable olefinically unsaturated double bond, an organic solvent-soluble polyurethane resin or polyamide resin which is solid at room temperature and has film-forming ability and a photopolymerization initiator;

(2) a crosslinked silicone rubber layer; and (3) a transparent cover coat layer, wherein the photopolymerization initiator comprises (a) a dialkylaminoaryl-carbonyl compound and (b) at least one member selected from the group consisting of xanthones, thioxanthones, acridones, benzophenones which do not carry a dialkylamino group, benzanthrones and anthraquinones and the transparent cover coat layer is formed from a biaxially oriented polypropylene film having a thickness ranging from 6 to 22 μm and an oxygen permeability ranging from 900 to 10,000 cc/m²/24 hr./atm. at 20° C.

2. The presensitized plate of claim 1 wherein the dialkylaminoarylcarbonyl compound is selected from the group consisting of 4,4 -bis(dimethylamino)benzophenone, 4,4'-bis(diethylamino)benzophenone, 4,4'-bis(dipropylamino) benzophenone, a compound of the following formula:

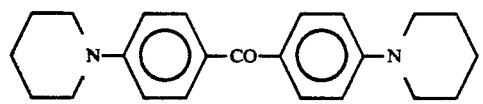

dialkylaminostyryl ketone compounds represented by the following general formulae:

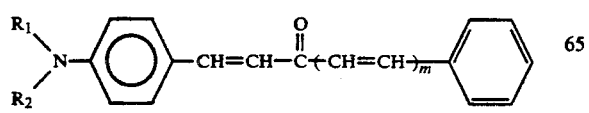

-continued

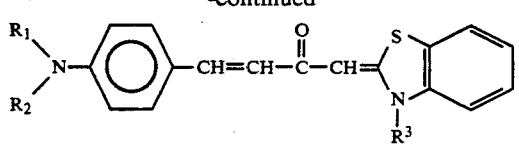

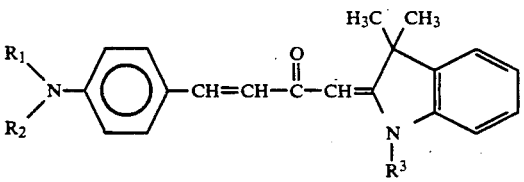

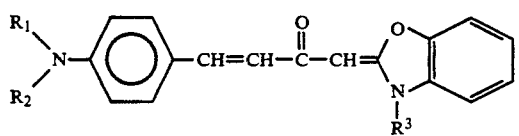

(wherein R¹, R² and R³ each represents a substituted or unsubstituted alkyl group, provided that R¹ and R² may be bonded together to form a cycloalkyl ring), 2-(p-dialkylaminophenyl) benzo [4,5] benzoxazole, 2,5-bis(p-dialkylaminophenyl)-1,3,4-oxadiazole (wherein the alkyl group is a methyl or ethyl group), compounds represented by the following general formulae:

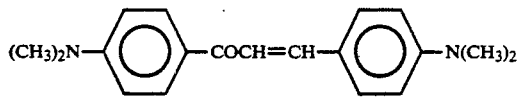

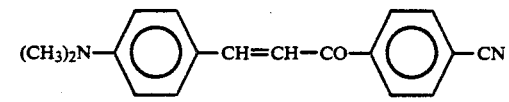

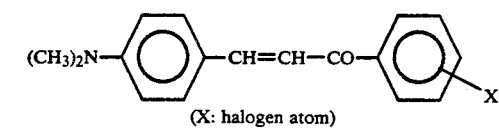

(X: halogen atom)

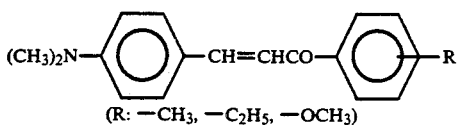

(R: —CH₃, —C₂H₅, —OCH₃)

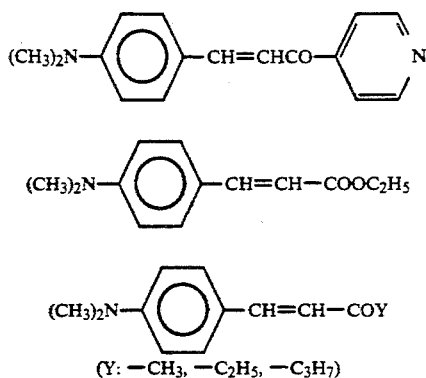

(Y: —CH₃, —C₂H₅, —C₃H₇)

3. The presensitized plate of claim 1 wherein the xanthones, thioxanthones, acridones, benzophenones which do not carry a dialkylamino group, benzanthrones and anthraquinones are selected from the group consisting of xanthone, 2-chloroxanthone, thioxanthone, 2-chlorothioxanthone, 2,4-dimethylthioxanthone, 2,4-diethylthioxan-thone, 2,4-dichlorothioxanthone, 2,4-diisopropylthioxanthone, 2-dodecylthioxanthone, 2-methyl-(5~8)-ethyl ester thioxanthone, octyl ester of thioxanthonedicarboxylic acid, 1-chloroanthraquinone, 2-chloroanthraquinone, 2-ethylanthraquinone, 2-t-butylanthraquinone, 1-chloro-N-methylacridone, 3-chloro-N-methylacridone, 2,3-dichloro-N-methylacridone, 2-chloro-N-ethylacridone, 2-chloro-N-butylacridone, 3-chloro N-benzylacridone, N-benzylacridone, N-butylacridone, N-ethylacridone, benzophenone, benzanthrone, 3-chlorobenzanthrone and dichlorobenzanthrone.

4. The presensitized plate of claim 1 wherein the total amount of the photopolymerization initiator ranges from 0.1 to 20% by weight on the basis of the total weight of the composition for the light sensitive layer and wherein the weight ratio of the initiator (a) and the initiator (b) ranges from 10:1 to 1:10.

5. The presensitized plate of claim 4 wherein the total amount of the photopolymerization initiator ranges from 3 to 15% by weight on the basis of the total weight of the composition for the light-sensitive layer and wherein the weight ratio of the initiator (a) and the initiator (b) ranges from 5:1 to 1:5.

6. The presensitized plate of claim 1 wherein it further comprises a mat layer applied onto the cover coat layer.

7. The presensitized plate of claim 1 wherein the surface of the cover coat layer is subjected to a corona discharge treatment and then a mat layer which is partially coated with a polyester resin or a polyvinylidene chloride resin containing silica powder is applied onto the cover coat layer.

8. The presensitized plate of claim 1 wherein the biaxially oriented polypropylene film is coated with another resin or combined with another film.

9. The presensitized plate of claim 1 wherein the amount of the primer layer coated ranges from 0.5 to 20 g/m² expressed in the weight determined after drying.

10. The presensitized plate of claim 1 wherein the Photopolymerizable light-sensitive layer further comprises other polymeric compounds having film-forming ability.

11. The presensitized plate of claim 10 wherein the ratio of the sum of the polyurethane or polyamide resin and the polymeric compound having film-forming ability to the amount of the monomer or the oligomer ranges from 99:1 to 30:70.

12. The Presensitized plate of claim 1 wherein the amount of the composition for forming the photopolymerizable light-sensitive layer to be coated ranges from about 0.1 to 10 g/m² on dry basis.

13. The presensitized plate of claim 12 wherein the amount of the composition for forming the photopolymerizable light-sensitive layer to be coated ranges from about 0.5 to 5 g/m² on dry basis.

14. The presensitized plate of claim 1 wherein the crosslinked silicone rubber layer is a layer of a partially or completely crosslinked polydiorganosiloxane having the following repeating units:

wherein R represents a monovalent group selected from the group consisting of alkyl, aryl and alkenyl groups and any combination thereof, which may have functional groups selected from the group consisting of halogen atoms, amino groups, hydroxyl group, alkoxy groups, aryloxy groups, (meth)acryloxy groups and thiol groups.

15. The presensitized plate of claim 1 wherein the crosslinked silicone rubber layer further comprises at least one member selected from the group consisting of silica, calcium carbonate, titanium oxide, silane coupling agents, titanate coupling agents, aluminum coupling agents and photopolymerization initiators.

16. The presensitized plate of claim 1 wherein the crosslinked silicone rubber layer further comprises a silane crosslinking agent represented by the following general formula:

$$R_nSiX_{4-n}$$

(wherein n is an integer ranging from 1 to 3; R is the same as that defined above; X represents —OH, —OR², —OAc, —O—N=CR²R³, —Cl, —Br or —I (wherein R² and R³ each is identical with R defined above and Ac represents an acetyl group)) and/or a catalyst.

17. The presensitized plate of claim 1 wherein the crosslinked silicone rubber layer is a condensed addition typo silicone rubber layer.

18. The presensitized plate of claim 17 wherein the condensed addition type silicone rubber layer is formed by hardening and crosslinking a composition which comprises:
(1) 100 parts by weight of an organopolysiloxane having at least two alkenyl groups directly bonded to the silicon atom per molecule;
(2) 0.1 to 1,000 parts by weight of an organo hydrogen polysiloxane carrying at least two

bonds in the molecule; and
(3) 0.00001 to 10 parts by weight of an addition catalyst.

19. The presensitized plate of claim 18 wherein the molecular weight of Component (1) exceeds 1,000.

20. The presensitized plate of claim 1 wherein the thickness of the silicone rubber layer ranges from 0.5 to 5 μm.

* * * * *